US006195286B1

(12) United States Patent
Pascucci

(10) Patent No.: US 6,195,286 B1
(45) Date of Patent: Feb. 27, 2001

(54) CIRCUIT AND METHOD FOR READING A NON-VOLATILE MEMORY

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/353,756

(22) Filed: Jul. 14, 1999

(30) Foreign Application Priority Data

Jul. 20, 1998 (EP) .................................................. 98830438

(51) Int. Cl.[7] .................................................. G11C 16/04
(52) U.S. Cl. .................................. 365/185.12; 365/185.17
(58) Field of Search ........................... 365/185.12, 185.17

(56) References Cited

U.S. PATENT DOCUMENTS 5,748,538 * 5/1998 Lee et al. ......................... 365/185.12
5,761,132   6/1998 Kim ................................. 365/189.05
5,940,321 * 8/1999 Takeuchi et al. ................ 365/185.17

FOREIGN PATENT DOCUMENTS 0 372 873 A3   12/1989 (EP) .

* cited by examiner

Primary Examiner—Trong Phan
(74) Attorney, Agent, or Firm—Theodore E. Galanthay; Allen, Dyer, Doppelt, Milbrath & Gilchrist, P.A.

(57) ABSTRACT

A circuit and method for reading a non-volatile memory include providing a first random memory reading cycle and performing, at the end of the random reading cycle, a collective page precharge. Then, performing a reading cycle of the page or random type, depending on whether the subsequent reading must be performed within the same page or not. Then, if a page reading cycle is performed, executing, when the data item is captured, a page precharge step in preparation for both page reading and random reading.

31 Claims, 4 Drawing Sheets

CIRCUIT AND METHOD FOR READING A NON-VOLATILE MEMORY

FIELD OF THE INVENTION

The present invention relates to a circuit and a method for reading a non-volatile memory. More particularly, the invention relates to a reading circuit of a non-volatile memory and an associated reader protocol.

BACKGROUND OF THE INVENTION

It is known that in a conventional non-volatile memory, a random reading method is normally used in which word lines and bit lines are selected randomly and independently. This procedure entails reading times which are the sum of a sequence of events which can be summarized substantially as follows: propagation of the word line and bit line selection paths; precharge activity; a data evaluation interval; and propagation for data transfer to the output buffer and transition time of the buffer.

The total reading time, given by the sum of the times of the individual operations listed above, depends not only on the dimensions and architecture of the memory but also on the type of device that is present in the memory, i.e., on the technology that is used. The advantages of the conventional architecture are that it is simple (a minimal number of memory structures), it allows easy timing (because all reading cycles are equal), it provides maximum efficiency for redundancy structures, and it has significantly low consumption because the number of current-consuming circuits is kept to the lowest possible value.

However, the limitations of the conventional architecture reside in the reading speed, which is very important in large memories. One approach for improving the reading speed is the use of "page mode" reading, in which a plurality of words in parallel, for example eight, are read in a first cycle. Then, the content of the reading operation is stored in a suitable register and the portion of the register that relates to the selected word within the packet of read words is displayed externally. In this manner it is possible to scan the words contained in the packet of read words in a significantly shorter time than with random reading. However, the first reading cycle continues to be dependent on the time of a random selection.

In any case, page-mode reading is affected by the following drawbacks: a large number of reader circuits (e.g., if eight words of eight bits each are read in parallel, sixty-four sense amplifiers are required); high current absorption during parallel reading; the provision of word registers; the provision of register decoding; a reduction in the effectiveness of redundancy structures (one line at a time can be replaced with a redundant line, but in the case of multiple reading, the possibilities of line fault increase, yet there is still only one redundant line available); and the reading protocol entails a double cycle time, random or page.

SUMMARY OF THE INVENTION

An object of the present invention is to provide a circuit and a method for reading a non-volatile memory which allow performance advantages to be achieved, with respect to the conventional reading approach, and yet are simplified with respect to the page-mode approach. Thus, an object of the present invention is to provide a circuit and a method for reading a non-volatile memory which keep the number of structures of the memory to a minimum.

Another object of the present invention is to provide a circuit and a method for reading a non-volatile memory which do not require the reduction of the effectiveness of redundancy or the implementation of additional reader and decoder registers. Another object of the present invention is to provide a circuit and a method for reading a non-volatile memory which avoid additional current consumption. Another object of the present invention is to provide a circuit and a method for reading a non-volatile memory which are highly reliable, relatively easy to provide and at competitive costs.

These objects and others which will become apparent hereinafter are achieved by a method for reading a non-volatile memory including the steps of: providing a first random memory reading cycle; performing, at the end of the random reading cycle, a collective page precharge; subsequently performing a reading cycle of the page or random type, depending on whether the subsequent reading must be performed within the same page or not; and if a page reading cycle is performed, executing, when the data item is captured, a page precharge step in preparation both for page reading and for random reading.

BRIEF DESCRIPTION OF THE PREFERRED EMBODIMENTS

Further characteristics and advantages of the invention will become apparent from the description of preferred but not exclusive embodiments of the circuit and of the method according to the invention, illustrated only by way of non-limitative examples in the accompanying drawings, wherein.

DETAILED DESCRIPTION OF THE PREFERRED EMBODIMENTS

Figure 1:
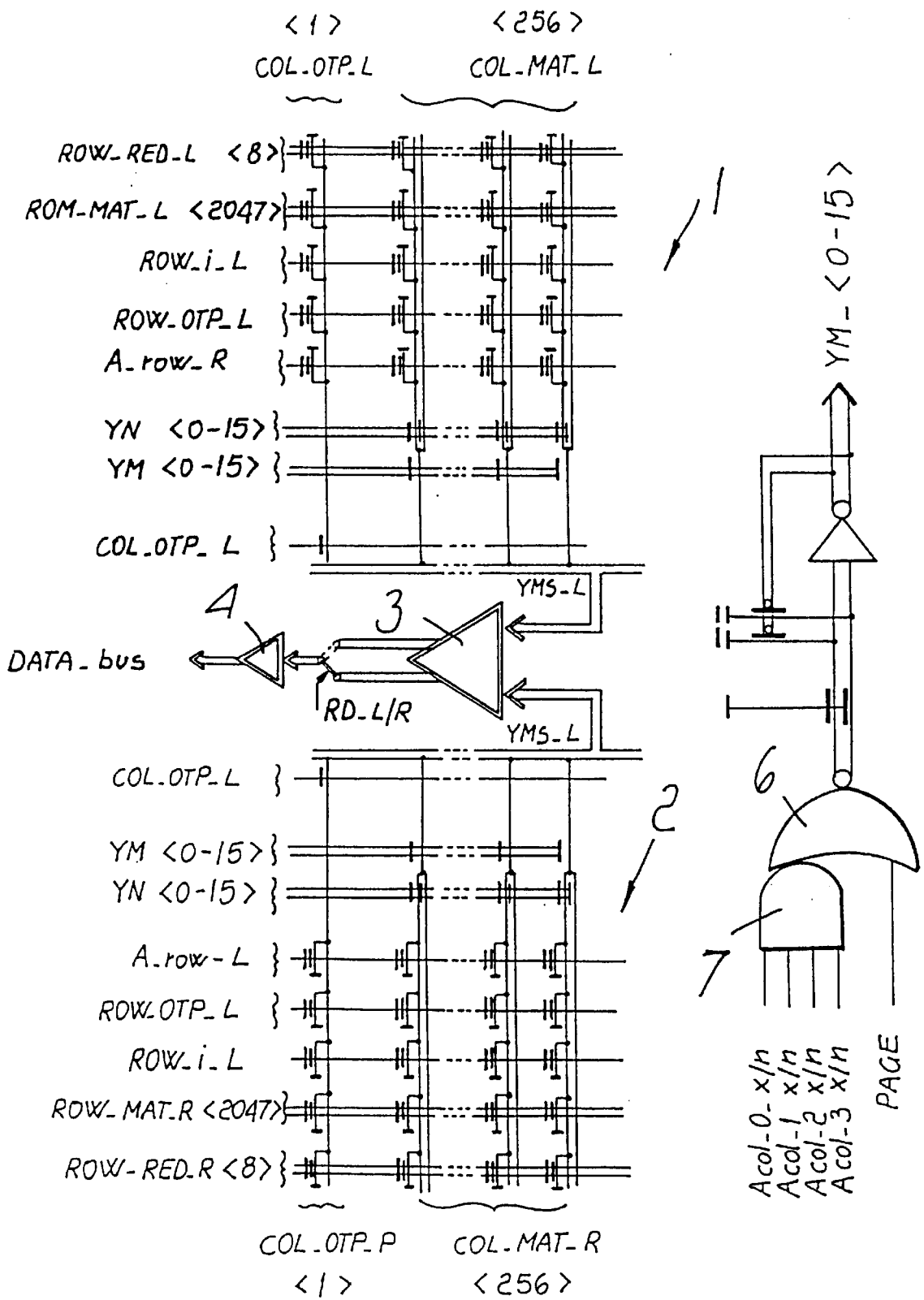
FIG. 1 is a schematic view of a first embodiment of an organizational structure of a non-volatile memory according to the present invention.

With reference to the above figures, the circuit for reading a non-volatile memory according to the invention operates with a memory which is divided into a right half-matrix 1 and a left half-matrix 2 which are arranged on two opposite half-planes. Each half-matrix has a plurality of memory cells arranged in rows and columns in addition to a plurality of redundancy memory cells. The memory cells are designated by the references ROW-MAT-R and ROW-MAT-L for the right half-matrix 2 and for the left half-matrix 1 respectively.

Sense amplifiers 3 are arranged between the two half-matrices and comparison bit lines are arranged on different half-matrices. A reference word line is provided for each one of the two half-matrices and each cell selected on the word line of one half-matrix is matched by the selection of a similar cell on the reference word line arranged on the opposite half-matrix. Column multiplexers are arranged symmetrically in each one of the two half-matrices. The two multiplexers are activated simultaneously so that each multiplexer selects, in its respective half-plane, two bit lines to be compared. Control buses YN-YM for the two multiplexers are provided to select a packet of bit lines (the bus YM) and a particular bit line within the packet (the bus YN).

It is known that a reading cycle for a conventional non-volatile memory has the characteristic of re-stimulating, at each address transition, all the selection paths and then continuing, as timing progresses, until external transfer of the data read from the memory is reached. This necessitates that each reading cycle is provided over a long time period because the time period is a sum of all the events, as mentioned above.

The invention, in particular, provides a dual reading cycle, following the model of page reading: a random cycle; and a page cycle. The expression "random cycle" is used to define every first reading cycle and every reading operation that does not act within a packet of memory locations which can be selected more quickly than locations belonging to different packets. The expression "page-type read cycle" is instead used to define any reading cycle that acts within a same packet of locations which can be selected more quickly than locations outside the packet.

A random cycle is performed with the same method as in a conventional-read memory, but an immediate page precharge activity is superimposed thereon. Page precharge occurs after the data item has been captured. Each random cycle is therefore performed as follows. First, a specific word line and a specific bit line are activated at the beginning of a reading cycle. At this point, there is reading timing progress for reading and capturing the data item, with subsequent transfer and display of the data read at the beginning of the memory. As soon as the read data has been captured, page precharge activity is initialized.

A generic random access occurs only if a subsequent reading must be performed in memory locations other than those of the page, i.e., if the bit line to be selected is outside the packet of bit lines selected by page precharge. A page reading cycle is performed starting from a preceding random cycle (which, as mentioned, already performs page precharge), thus maintaining the word line selection. Then, a page location is selected and the data item of the memory cell is extracted and transferred and thus displayed externally. Finally, page precharge is initialized as soon as the read data item has been captured.

A set of lines is precharged simultaneously in the time interval between the capture of the current data item and the beginning of a new read cycle. The selection operation occurs very quickly and isolates, among the selected bit lines, the one on which the cell to be read is to be identified. The selected bit line (whose precharge has already been performed in the previous reading cycle) remains under evaluation only for the time required for residual and optionally finer precharge, construction of the cell signal, and evaluation/capture of the cell data item.

The above-described reading protocol allows path selection time and precharge time to be recovered, thus allowing a faster page reading cycle, to freeze the number of necessary memory structures and to contain peak consumption. In addition, this protocol allows the full utilization of the effectiveness of the redundancy structures.

Figure 2:
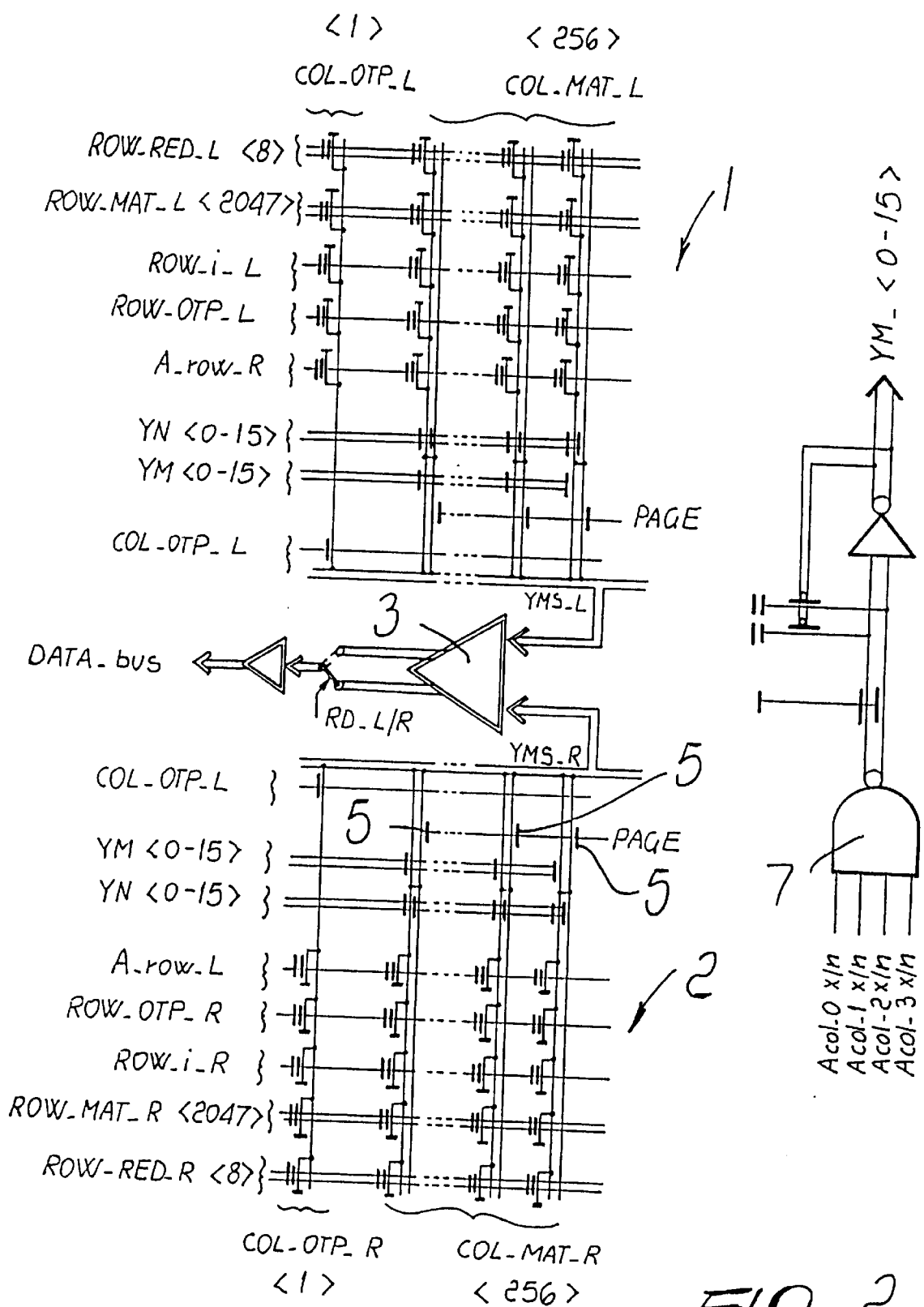
FIG. 2 is a schematic view of a second embodiment of an organizational structure of a non-volatile memory according to the present invention.

During reading (programming), the control buses YN-YM of the two multiplexers have only one active line and can be in two conditions during page precharge. The bus YM is forced fully to logic level "1" by a forcing signal (PAGE) and the bus YN is set to univocal selection, indicating a page read mode; or, both buses are in the univocal selection configuration but can, in the case of FIG. 2, be bypassed by devices which are stimulated with the PAGE control signal, which is synchronous with the precharge signal.

If passage from one bit line selection to the other occurs only by changing the configuration of the bus YM but not of the bus YN, after an initial reading activity, this indicates that the page is the same and can be advantageously read at the chosen location. If instead there is even just one change among the lines YN, then this indicates that a page change has occurred and that a random reading activity must therefore be performed.

The architecture shown in FIG. 1 shows the sense amplifiers 3 connected to tristate type structures 4, which are connected to a data bus designated by the reference sign DATA-bus. The architecture shown in FIG. 2 differs from the architecture of FIG. 1 in that the signal PAGE is sent directly to the gate terminals of transistors 5 which are connected to the decoding buses YM and YN.

On the contrary, in the architecture of FIG. 1, the page control signal PAGE is sent in input to a NOR gate 6 together with a column selection signal, i.e., a bit line selection signal (the word line WL always remains the same in the case of page reading, while the bit line BL changes every time) obtained by inputting column addresses to an AND gate 7. If the column address corresponds to the bit line group, i.e., to the packet of bit lines grouped under the PAGE control, then the control bus YM becomes entirely high and the simultaneous selection of bit lines is activated. Thus, the signal PAGE forces all the lines YM to 1, regardless of the output of the logic gate 7. If the signal PAGE is low, the AND gate is selected univocally and selects a single line.

Figure 3:
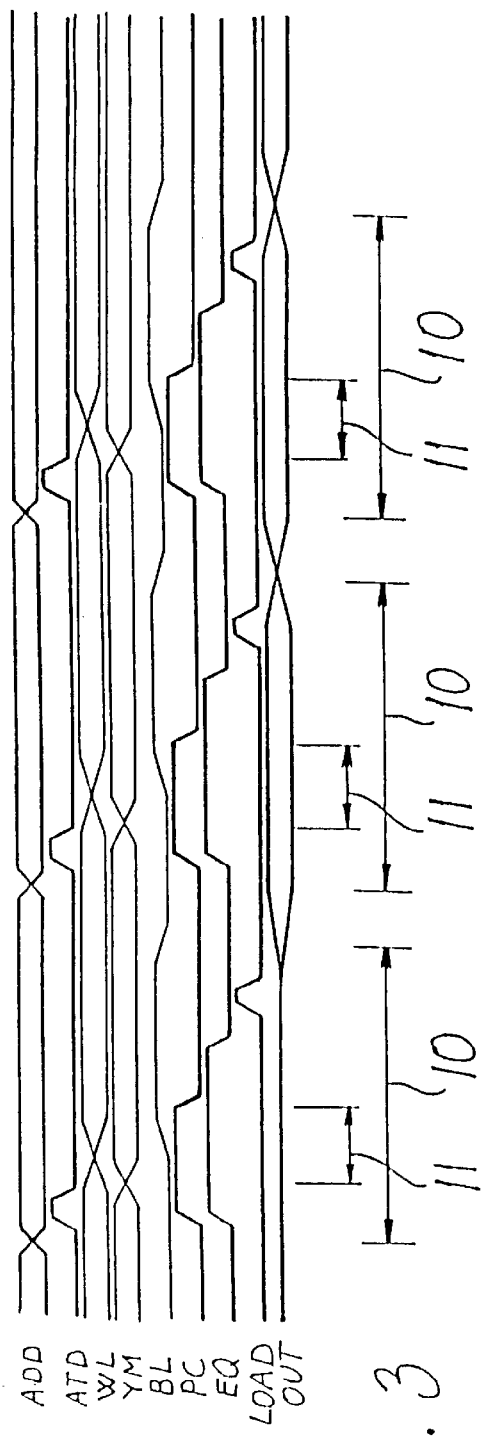
FIG. 3 is a chart of the reading timings of a non-volatile memory according to a known reading cycle, which points out the regularity of the timing events (reading cycles), as in the prior art.
Figure 4:
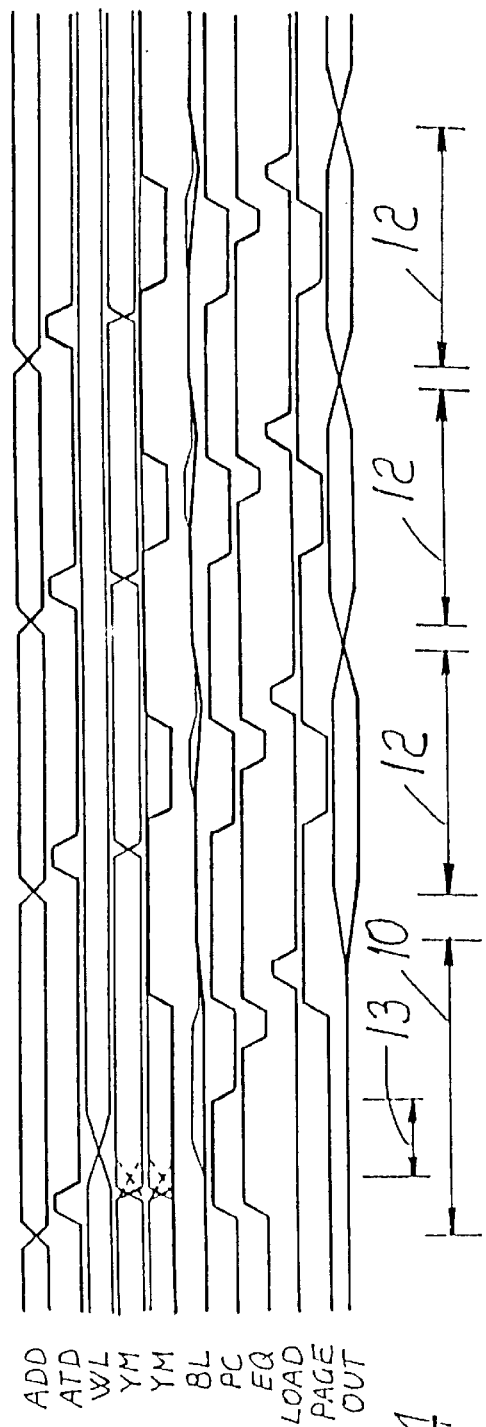
FIG. 4 is a chart of the read timings of a non-volatile memory according to a reading cycle provided with the circuit and the method according to the present invention.
Figure 5:
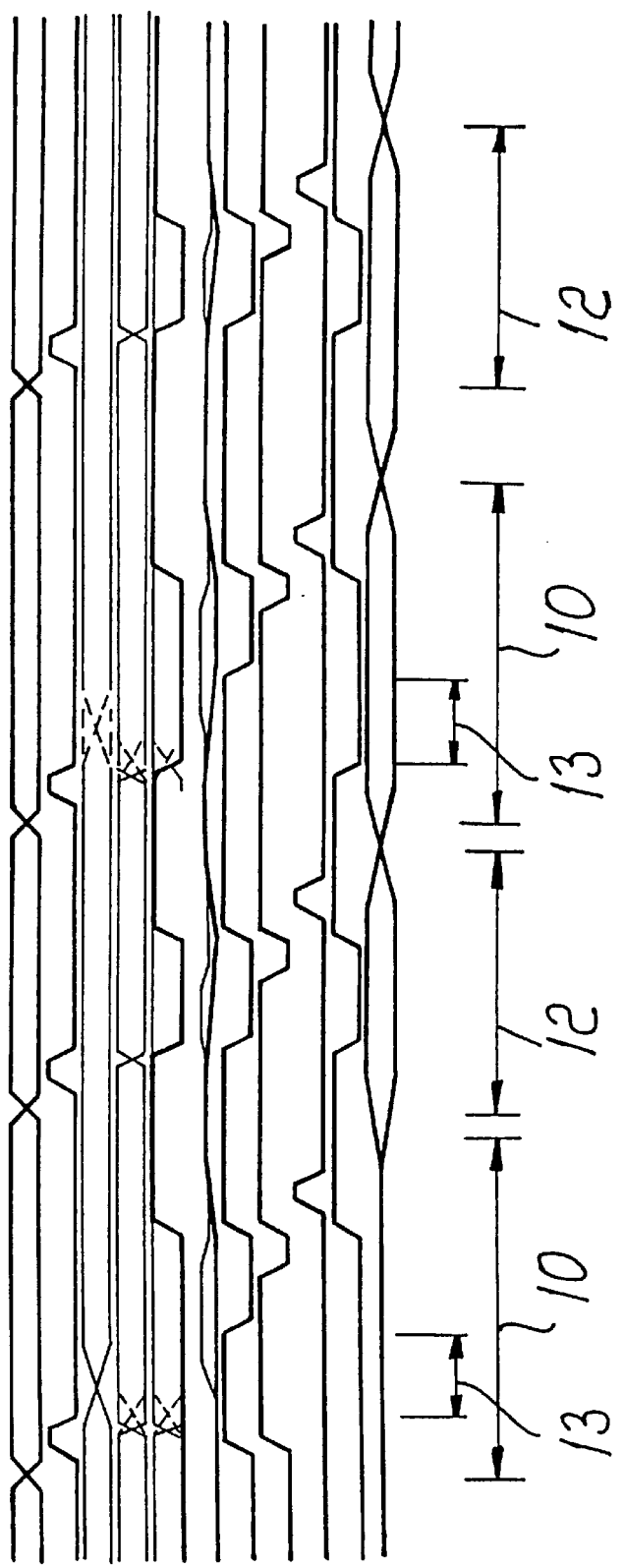
FIG. 5 is a chart of the reading timings of a non-volatile memory provided according to the invention and with continuous page changing after an initial random cycle.

If even just one YN changes, then this indicates that the selected bit line does not belong to the packet of bit lines that are precharged together and it is therefore necessary to perform a random reading activity again and then attempt a subsequent page reading. With reference now to the timing charts of FIGS. 3, 4 and 5, FIG. 3 plots the reading timing for successive conventional random cycles, in which the random cycle is designated by the reference numeral 10 and the reference signs arranged laterally to the chart are to be interpreted as follows. The reference ADD designates the address transition, i.e., the address change. The reference ATD designates address transition detection. The reference WL designates the word line. The reference YM designates the control bus described above, which is suitable to select a bit line packet. The reference BL designates the bit line; the reference PC designates the bit line precharge step; and the reference EQ designates the equalization step. The reference LOAD designates the step for loading the data into the output buffers; the reference PAGE designates the signal for activating the page reading mode; and the reference OUT designates the output of the read data from the memory.

In FIG. 3 the reference numeral 11 designates the bit line selection time at each random reading cycle. FIG. 4 instead plots the reading cycle that uses a random reading mode followed by a page reading mode. In this case, the random cycle is again designated by the reference numeral 10, while the page-mode reading cycle is designated by the reference numeral 12. These page-mode reading cycles 12 have a shorter duration than the random reading cycles 10. The random cycle is never affected by the stimulus of the signal PAGE in the initial step; it is affected only at the end. At the references YM indicating the control buses, the portions shown in dashed lines correspond to the behavior of the bus YM if a random reading cycle were used each time instead of a page cycle after an initial random cycle.

Regarding the behavior of the bit line BL, FIG. 4 shows that after the initial random cycle 10, which follows a preceding page cycle 12 (not shown in the figure for the sake of convenience), all the bit lines BL that are not selected are brought to zero, while only the bit line BL that must be selected remains high. Therefore, different from the conventional random cycle in which a single bit line is selected, when page mode reading, all the bit lines that belong to a same packet are precharged in advance and then only the bit line that must actually be selected is kept high, while the remaining bit lines are discharged. This behavior is pointed out by the chart showing the development of the bit lines BL in FIG. 4. In this manner it is possible to have an additional selection time 13 which is saved with respect to the bit line selection that occurs in the conventional random cycle.

Finally, FIG. 5 illustrates the case of the present invention, in which a random cycle is followed by a page cycle but in which a page precharge is performed at the end of the random cycle in order to prepare the memory for the subsequent page-mode reading. FIG. 5 shows that the page cycle is performed starting from a preceding random cycle which, as mentioned, already performs a page precharge at the end. In this case, the word lines WL are maintained, since the activity occurs within a same page, and a page location is selected. In this manner, page precharging occurs collectively and simultaneously on the same number of matrix and reference lines arranged in the two opposite half-planes, while the evaluation step is also conducted symmetrically and is of course limited to its line of the data item to be read.

The above-described architecture, together with the reading protocol, limits the page-mode reading time to the time required for in-page selection and evaluation/capture and transfer of the data item. In-page selection time is reduced by performing selection exclusively via the bus lines YM (which are less capacitive than the corresponding lines YN), eliminating any resistive extra load during execution and assigning appropriate dimensions to the drivers of the lines. The reading protocol according to the invention therefore entails a succession of random and page cycles, depending on whether the selected line belongs to a same packet of bit lines.

In practice, it has been observed that the circuit and the method for reading a non-volatile memory according to the invention fully achieve the intended objects, because they increase the reading speed of a non-volatile memory by utilizing a hybrid random and page reading. The circuit and the method thus described can include numerous modifications and variations, all of which are within the intended scope of the invention. Also, all the details may be replaced with other technically equivalent elements.

What is claimed is:

1. A memory circuit comprising:
   a memory having a plurality of memory cells arranged in rows and columns; and
   a reading circuit for performing a first random reading of the memory, for performing a precharge of a page at an end of the first random reading, and for performing a subsequent reading which includes a page reading and a second page precharge in preparation for both page reading and random reading after a data item has been accessed, if the subsequent reading is to be performed within the page, and which includes a second random reading cycle if a subsequent reading is not to be performed within the page.

2. The memory circuit according to claim 1, wherein the first random reading comprises:
   selecting a word line and a bit line which define a first memory cell whose content is to be read;
   precharging and equalizing the bit line;
   reading a data item contained in the first memory cell and outputting the data item; and
   precharging a plurality of bit lines that belong to a page during an interval between reading the data item and a beginning of a new reading cycle.

3. The memory circuit according to claim 2, wherein the page reading comprises:
   maintaining the selection of a selected word line selected during the random reading;
   selecting a second memory cell within the page;
   reading a second data item from the second memory cell;
   outputting and displaying the second data item; and
   precharging the page after the second data item is accessed.

4. The memory circuit according to claim 1, wherein the memory further comprises:
   a pair of symmetric half-matrices which lie in respective opposite half-planes, each half-matrix having a plurality of memory cells arranged in rows and columns;
   a pair of symmetrical column multiplexers each of which is arranged in one of the half-matrices and each of which can select a bit line within the corresponding half-plane, wherein each column multiplexer comprises a pair of control buses, a first one of the control buses is for selecting a page of the memory, and a second one of the control buses is for selecting a bit line within the memory page.

5. The memory circuit according to claim 4, further comprising:
   a first logic gate connected to the first one of the control buses, for receiving a page control signal and a column selection signal;
   a second logic gate for receiving column addresses and outputting the column selection signal to the first logic gate;
   an amplifier connected to the column multiplexers; and
   a data bus connected to the amplifier, for outputting data from the memory.

6. The memory circuit according to claim 4, further comprising:
   a plurality of column transistors each being connected to the control buses, for receiving a page control signal;
   a logic gate for receiving column addresses and outputting a column selection signal to the first one of the control buses;
   an amplifier connected to the column multiplexers; and
   a data bus connected to the amplifier, for outputting data from the memory.

7. A method for reading a non-volatile memory, comprising the steps of:
   performing a first random reading cycle;
   performing a page precharge at the end of the first random reading cycle;
   subsequently performing a page reading cycle or a second random reading cycle, depending on whether the subsequent reading is to be performed within a same page or not; and
   if a page reading cycle is performed, executing a page precharge in preparation both for page reading and for random reading, when a data item is accessed.

8. The method according to claim 7, wherein the first random reading cycle comprises the steps of:

selecting, in response to an address transition, a word line and a bit line which define a first memory cell whose content is to be read;

precharging and equalizing the bit line;

reading a data item contained in the first memory cell and outputting the data item; and precharging a plurality of bit lines that belong to a page during an interval between reading the data and a beginning of a new reading cycle.

9. The method according to claim 8, wherein the page read cycle comprises the steps of:

starting from the first or a subsequent random reading cycle in which a page precharge has been performed at the end, and maintaining the selection of a selected word line selected in the random reading cycle;

selecting a second memory cell within the page;

reading a second data item from the second memory cell;

outputting and displaying the second data item; and precharging the page after an access of the second data item.

10. The method according to claim 9, wherein the step of selecting a second memory cell within the page comprises the step of selecting a bit line to be read within the page at the word line that is currently selected.

11. The method according to claim 10, wherein the selected bit line remains in an evaluation step for a time required for residual precharge, construction of a cell signal and evaluation and capture of the data item of the second memory cell.

12. The method according to claim 7, wherein the non-volatile memory comprises a memory matrix which is divided into two symmetric half-matrices which lie in two opposite half-planes, and wherein the page precharge step is performed simultaneously on a plurality of bit lines of one half-matrix and on a same plurality of corresponding bit lines on the other half-matrix.

13. The method according to claim 12, wherein each one of the memory half-matrices includes a column multiplexer which can select a bit line within the corresponding half-plane.

14. The method according to claim 12, wherein each column multiplexer comprises a pair of control buses, a first one of the control buses to select a page of the memory, a second one of the control buses to select a bit line within the memory page.

15. The method according to claim 14, wherein during the page precharge step the page selection control bus is simultaneously forced to a predetermined logic level by a page reading indication signal.

16. The method according to claim 14, wherein a page reading indication signal is sent for a direct selection of the word line, during the page precharging step.

17. The method according to claim 7, wherein a second random reading cycle is executed only if a memory cell to be read does not belong to the memory page.

18. The method according to claim 7, wherein a number of bit lines are simultaneously precharged and correspond to the word length.

19. The method according to claim 7, wherein during a step for reading evaluation of a data item, only one bit line is selected, and wherein the bit line is selected in page reading mode from among the previously precharged lines.

20. The method according to claim 7, wherein if the reading cycle is the random reading cycle, a page reading indication signal is produced exclusively at the end of the reading.

21. The method according to claim 20, wherein the page reading indication signal is active in a time interval that directly follows a memory reading until a new reading cycle begins.

22. The method according to claim 20, wherein the page reading indication signal is input to a NOR gate together with a bit line signal which is obtained by inputting column addresses to an AND gate.

23. A method for reading a memory, comprising the steps of:

performing a first random reading cycle;

performing a precharge of a page at an end of the first random reading cycle; and performing a subsequent reading cycle, wherein the subsequent reading cycle includes a page reading cycle and a second page precharge in preparation for both page reading and random reading after a data item has been accessed, if the subsequent reading is to be performed within the page, and wherein the subsequent reading cycle includes performing a second random reading cycle if a subsequent reading is not to be performed within the page.

24. The method according to claim 23, wherein the first random reading cycle comprises the steps of:

selecting a word line and a bit line which define a first memory cell whose content is to be read;

precharging and equalizing the bit line;

reading a data item contained in the first memory cell and outputting the data item; and precharging a plurality of bit lines that belong to a page during an interval between reading the data item and a beginning of a new reading cycle.

25. The method according to claim 24, wherein the page read cycle comprises the steps of:

maintaining the selection of a selected word line selected in the random reading cycle;

selecting a second memory cell within the page;

reading a second data item from the second memory cell;

outputting and displaying the second data item; and precharging the page after the second data item is accessed.

26. The method according to claim 25, wherein the step of selecting a second memory cell within the page comprises the step of selecting a bit line to be read within the page at the word line that is currently selected.

27. The method according to claim 23, wherein the memory comprises a memory matrix which is divided into two symmetric half-matrices which lie in two opposite half-planes, and wherein the page precharge step is performed simultaneously on a plurality of bit lines of one half-matrix and on a same plurality of corresponding bit lines on the other half-matrix.

28. The method according to claim 27, wherein each one of the memory half-matrices includes a column multiplexer which can select a bit line within the corresponding half-plane.

29. The method according to claim 28, wherein each column multiplexer comprises a pair of control buses, a first one of the control buses to select a page of the memory, a second one of the control buses to select a bit line within the memory page.

30. The method according to claim 23, wherein a second random reading cycle is performed only if a memory cell to be read does not belong to the page.

31. The method according to claim 23, wherein a number of bit lines are simultaneously precharged and correspond to the word length.

* * * * *